United States Patent
Chen et al.

(10) Patent No.: US 8,526,192 B2
(45) Date of Patent: Sep. 3, 2013

(54) BOSS FOR SECURING PAIR OF MAINBOARDS

(75) Inventors: Pin-Cheng Chen, Taipei (TW); Te-Cheng Lee, Taipei (TW); Hung-Pin Lin, Taipei (TW); Yao-Yu Lai, Taipei (TW); Cheng-Hsin Chen, Taipei (TW)

(73) Assignee: Inventec Corporation, Taipei (TW)

( * ) Notice: Subject to any disclaimer, the term of this patent is extended or adjusted under 35 U.S.C. 154(b) by 13 days.

(21) Appl. No.: 13/350,831

(22) Filed: Jan. 16, 2012

(65) Prior Publication Data

US 2013/0141852 A1 Jun. 6, 2013

(30) Foreign Application Priority Data

Dec. 6, 2011 (TW) .............................. 100144887 A

(51) Int. Cl.
 *H05K 5/00* (2006.01)
(52) U.S. Cl.
 USPC ........... 361/758; 361/792; 361/742; 403/167; 403/168; 174/138 E; 174/138 G; 411/80.6; 411/60.2; 411/55; 411/45; 411/56

(58) Field of Classification Search
 USPC ................. 361/679, 679.01, 742, 758, 770, 361/804; 174/138 E, 138 G
 See application file for complete search history.

(56) References Cited

U.S. PATENT DOCUMENTS

| | | | | |
|---|---|---|---|---|
| 4,760,495 A | * | 7/1988 | Till | 361/804 |
| 6,287,044 B1 | * | 9/2001 | Huber | 403/297 |
| 6,896,460 B2 | * | 5/2005 | Enomoto et al. | 411/41 |
| 7,349,222 B2 | * | 3/2008 | Kim | 361/758 |
| 7,954,289 B2 | * | 6/2011 | Evans | 52/298 |

* cited by examiner

*Primary Examiner* — Hoa C Nguyen
*Assistant Examiner* — Robert Brown
(74) *Attorney, Agent, or Firm* — CKC & Partners Co., Ltd.

(57) ABSTRACT

A boss for securing a pair of mainboards includes a circular top and a plurality of first flexible legs. The first flexible legs are disposed on one side of the circular top and are separated from each other. Each of the first flexible legs includes a tilted wall and a pressing component. The tilted wall is formed on a surface of the first flexible leg that faces another first flexible leg. The pressing component is formed on one end of the first flexible leg away from the circular top. The tilted walls of all the first flexible legs cooperatively define a tapered channel. The tapered channel can be expanded.

11 Claims, 7 Drawing Sheets

BOSS FOR SECURING PAIR OF MAINBOARDS

RELATED APPLICATIONS

This application claims priority to Taiwan Application Serial Number 100144887, filed Dec. 6, 2011, which is herein incorporated by reference.

BACKGROUND

1. Field of Invention

The invention relates to a device for securing circuit boards. More particularly, the invention relates to a boss for securing a pair of mainboards and a system using the same.

2. Description of Related Art

With the increasingly rapid development of science and technology, various electronic devices are widely used in our daily lives. These electronic devices typically have circuit boards disposed therein for installing electronic elements. To protect the electronic elements, the stability of the circuit boards is of great importance.

Two ways are typically used in securing mainboards of a computer. The first involves disposing a shaft sleeve formed by surface mount technology (SMT) on a lower mainboard, and then using a screw that is extended through a through-hole in an upper mainboard and threaded into the shaft sleeve, so as to secure the upper and lower mainboards. However, the mainboards are not secured in a sufficiently stable manner using such a technique.

The second way in which mainboards are secured involves forming screw holes in both the upper and lower mainboards, arranging a double ended tapping shaft sleeve between the screw holes of the upper and lower mainboards, and using two screws to secure the upper and lower mainboards from two sides. However, with this approach, it is necessary to use two screws, which increases overall costs.

As can be known from the foregoing descriptions, there are still some difficulties and challenges encountered with the existing technologies used for securing mainboards that need to be overcome.

SUMMARY

In view of the above, an aspect of the invention provides a boss for securing a pair of mainboards.

The invention uses a single screw to secure a pair of mainboards (i.e., an upper mainboard and a lower mainboard), and does so in a way that the upper mainboard and the lower mainboard are secured in a stable manner.

According to an embodiment of the invention, a boss for securing a pair of mainboards includes a circular top and a plurality of first flexible legs. The first flexible legs are disposed on one side of the circular top and are separated from each other. Each first flexible leg includes a tilted wall and a pressing component. The tilted wall is formed on a surface of the first flexible leg that faces another first flexible leg. The pressing component is formed on one end of the first flexible leg away from the circular top. The tilted walls of all the first flexible legs cooperatively define a tapered channel. The tapered channel can be expanded.

In some embodiments, the pressing component may include a body, a neck portion and a pressing hook. The neck portion is connected to the body on one end. The pressing hook is parallel to the body and protrudes on the other end of the neck portion.

In some embodiments, each first flexible leg includes a vertical wall connected to one side of the tilted wall away from the pressing component, and the vertical walls cooperatively define a cylindrical channel. In some embodiments, the vertical wall is provided with a thread. In some embodiments, the circular top includes an opening in communication with the above-mentioned cylindrical channel. In some embodiments, the boss for securing a pair of mainboards may include a top bulging wall protruding from the edge of the opening of the circular top. In some embodiments, the number of the first flexible legs may be 2 or 4.

In some embodiments, the boss for securing a pair of mainboards may include a plurality of second flexible legs disposed on the other side of the circular top opposite to the first flexible legs and separated from each other. Each second flexible leg includes a tilted wall formed on a surface of the second flexible leg that faces another second flexible leg.

Another aspect of the invention provides a system for securing a pair of mainboards, which includes a boss for securing a pair of mainboards as described above, a securing member, a first mainboard and a second mainboard. The securing member has a cap body and a boss body, and the boss body is pressed against the tilted walls of the first flexible legs. The first mainboard has a through-hole, and the through-hole is pressed by the pressing components of the first flexible legs. The second mainboard is sandwiched and pressed between the cap body and the circular top.

A further aspect of the invention provides a system for securing a pair of mainboards, which includes a boss for securing a pair of mainboards as described above, a securing member, a first mainboard and a second mainboard. The securing member includes a cap body, a crown body and a boss body. The boss body is pressed against the tilted walls of the first flexible legs. The cap body is pressed and engaged with the second flexible legs. The crown body is pressed against the tilted walls of the second flexible legs. The first mainboard has a through-hole, and the through-hole is pressed by the pressing components of the first flexible legs. The second mainboard is sandwiched and pressed between the second flexible legs and the circular top.

By using the above-mentioned configurations and techniques, a user can insert the securing member into the tapered channel and apply a force on the tilted wall, so that the tapered channel is expanded outwardly and, in turn, the pressing component is driven to press against the through-hole of the first mainboard. The second mainboard may be pressed against the circular top by the cap body of the securing member or the second flexible leg. Therefore, in embodiments of the invention, a single securing member can be used to secure two mainboards. Furthermore, the pressing component may be pressed against the first mainboard through the force applied by the securing member to the tilted wall, thereby realizing enhanced stability in the securing of the two mainboards.

BRIEF DESCRIPTION OF THE DRAWINGS

In order to make the foregoing as well as other aspects, features, advantages and embodiments of the invention more apparent, the accompanying drawings are described as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
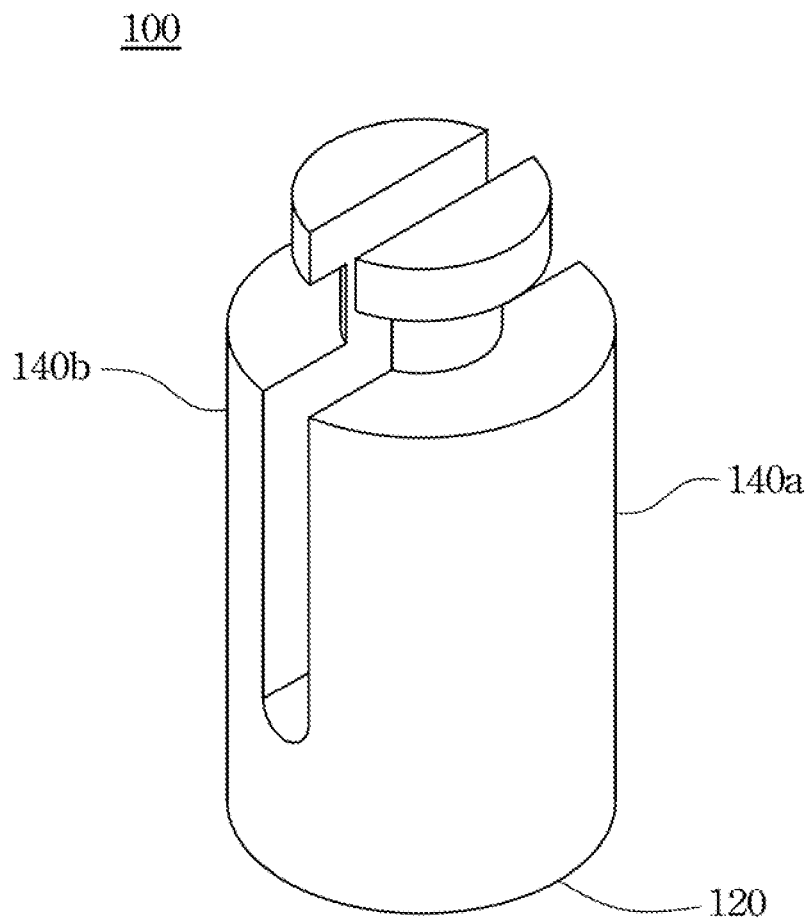
FIG. 1 is a perspective view of a boss for securing a pair of mainboards according to an embodiment of the invention.
Figure 2:
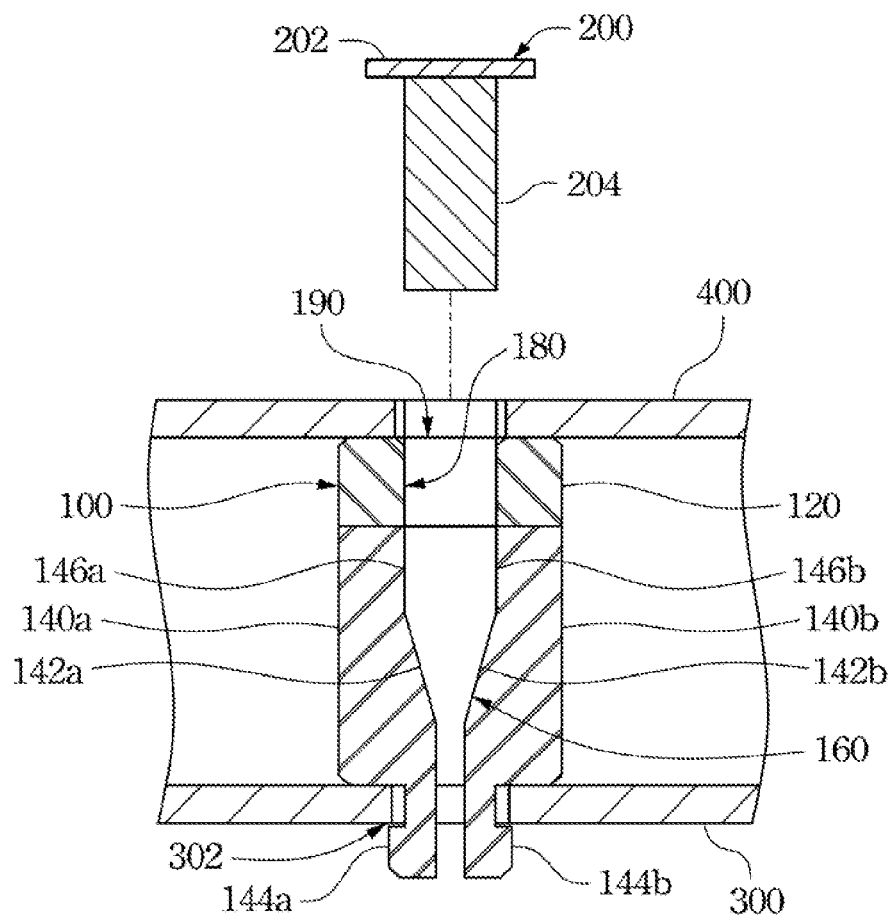
FIG. 2 is a sectional view of a system for securing a pair of mainboards that uses the boss for securing a pair of mainboards shown in FIG. 1.

FIG. 1 is a perspective view of a boss for securing a pair of mainboards according to an embodiment of the invention. FIG. 2 is a sectional view of a system for securing a pair of mainboards that uses the boss for securing a pair of mainboards shown in FIG. 1. As shown in FIGS. 1 and 2, a boss for securing a pair of mainboards 100 includes a circular top 120, a first flexible leg 140a, and another first flexible leg 140b. The first flexible legs 140a and 140b are disposed on one side of the circular top 120 and are respectively separated from each other. The first flexible leg 140a includes a tilted wall 142a and a pressing component 144a. The first flexible leg 140b includes a tilted wall 142b and a pressing component 144b. The tilted wall 142a is formed on a surface of the first flexible leg 140a that faces the first flexible leg 140b. The tilted wall 142b is formed on a surface of the first flexible leg 140b that faces the first flexible leg 140a. The pressing component 144a is formed on one end of the first flexible leg 140a away from the circular top 120. The pressing component 144b is formed on one end of the first flexible leg 140b away from the circular top 120. The tilted walls 142a and 142b of the first flexible legs 140a and 140b together define a tapered channel 160. The tapered channel 160 can be expanded.

As shown in FIG. 2, a system for securing a pair of mainboards may include a securing member 200, a first mainboard 300 and a second mainboard 400. The securing member 200 has a cap body 202 and a boss body 204. The boss body 204 may be pressed against the tilted walls 142a and 142b. The first mainboard 300 has a through-hole 302, which is pressed by the pressing components 144a and 144b. The second mainboard 400 may be sandwiched and pressed between the cap body 202 and circular top 120.

A user can insert the securing member 200 into the tapered channel 160 and thereby apply a force on the tilted walls 142a and 142b, so that the tapered channel 160 is expanded outwardly. As a result, the pressing components 144a and 144b are driven to press against the through-hole 302 of the first mainboard 300. The second mainboard 400 may be pressed against the circular top 120 by the cap body 202 of the securing member 200. Therefore, in embodiments of the invention, a single securing member 200 can be used to secure the first mainboard 300 and the second mainboard 400. Furthermore, the pressing components 144a and 144b may be pressed against the through-hole 302 of the first mainboard 300 through the force applied by the securing member 200 to the tilted walls 142a and 142b, thereby realizing enhanced stability in the securing of the first and second mainboards 300 and 400.

Figure 3:
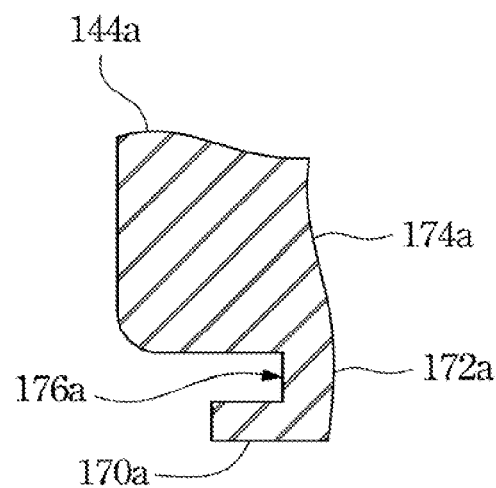
FIG. 3 is a partial sectional view of a pressing component shown in FIG. 2.

FIG. 3 is a partial sectional view of the pressing component shown in FIG. 2. The pressing component 144a is taken as an example in FIG. 3. That is, since the pressing component 144b has a similar opposite shape as the pressing component 144a, to simplify the description, only the pressing component 144a is illustrated and described. As shown in FIG. 3, the pressing component 144a includes a pressing hook 170a, a neck portion 172a and a body 174a. The neck portion 172a is connected to the body 174a on one end. The pressing hook 170a is parallel to the body 174a and protrudes from the other end of the neck portion 172a. Therefore, the pressing component 144a can be pressed against the through-hole 302 of the first mainboard 300 through each of the pressing hook 170a, the body 174a and a surface 176a of the neck portion 172a. The distance between the pressing hook 170a and the body 174a may be equal to the thickness of the first mainboard 300, so that the pressing hook 170a and the body 174a together press the first mainboard 300.

Referring back to FIG. 2, in some embodiments, the first flexible leg 140a includes a vertical wall 146a connected to one side of the tilted wall 142a away from the pressing component 144a. Similarly, the first flexible leg 140b includes a vertical wall 146b connected to one side of the tilted wall 142b away from the pressing component 144b. The vertical walls 146a and 146b together define a cylindrical channel 180. The size and shape of the cylindrical channel 180 may, for example, fit the securing member 200 to facilitate insertion of the securing member 200 into the cylindrical channel 180. The above-mentioned vertical walls 146a and 146b are formed as "vertical" lines when observed in cross section. However, from a perspective view of the securing member 200, the vertical walls 146a and 146b may appear curved, and such a configuration results in the formation of the cylindrical channel 180.

In some embodiments, each of the vertical walls 146a and 146b is provided with a thread. For example, the vertical walls 146a and 146b may be provided with a female thread. Moreover, the surface of the boss body 204 of the securing member 200 may be provided with a male thread. Therefore, the threads may be engaged with each other, so as to facilitate the securing member 200 being secured in the cylindrical channel 180.

In some embodiments, the circular top 120 includes an opening 190 in communication with the cylindrical channel 180. The opening 190 allows the securing member 200 to be inserted into the cylindrical channel 180. The size of the opening 190 may, for example, be equal to that of the cylindrical channel 180.

Figure 4:
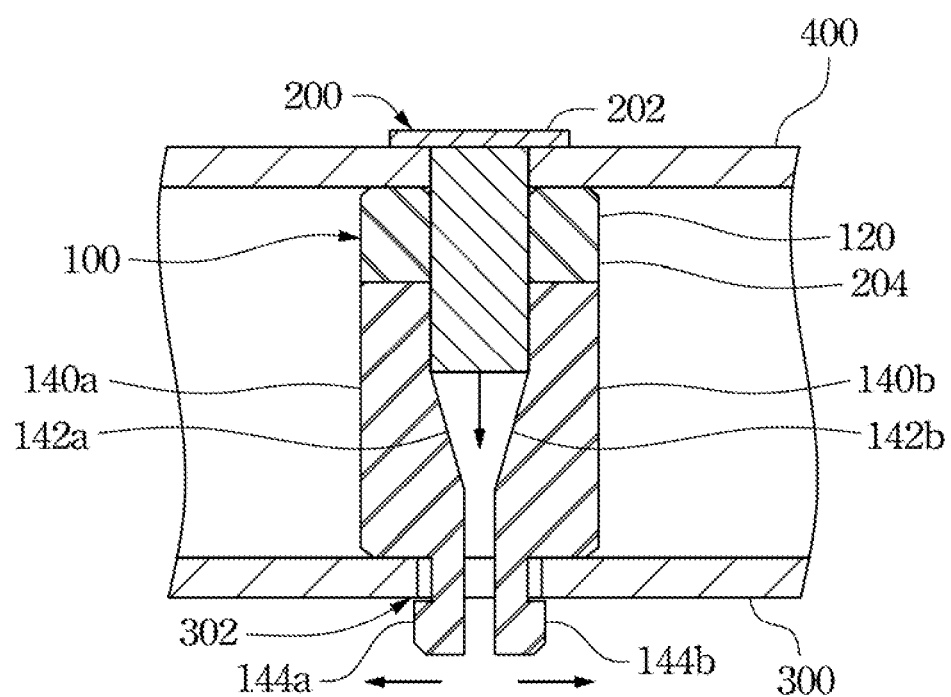
FIG. 4 is a sectional view illustrating operations involved in using the system for securing a pair of mainboards shown in FIG. 2.

FIG. 4 is a sectional view illustrating the operations involved in using the system for securing a pair of mainboards shown in FIG. 2. As shown in FIG. 4, the securing member 200 may be inserted into the cylindrical channel 180 (see FIG. 2), so that the securing member 200 is pressed against the tilted walls 142a and 142b. Since the securing member 200 applies a force to the tilted walls 142a and 142b (as indicated by the arrow under the securing member 200), and the tilted walls 142a and 142b move outwardly due to the inherent flexibility thereof, the tapered channel 160 (also see FIG. 2) is expanded outwardly, that is, in a direction away from each other. Therefore, the pressing components 144a and 144b are driven to move outwardly, that is, away from each other (as indicated by the arrows under the pressing components 144a and 144b in FIG. 4). Hence, the pressing components 144a and 144b are pressed against the through-hole 302 of the first mainboard 300 for securing the first mainboard 300.

When the securing member 200 is secured in the cylindrical channel 180, the second mainboard 400 is sandwiched and pressed between the cap body 202 and the circular top 120. That is to say, the cap body 202 is pressed on the second mainboard 400, and the second mainboard 400 is further forced to be secured between the cap body 202 and the circular top 120, so as to secure the second mainboard 400. Therefore, in embodiments of the invention, a single securing member 200 can be used to secure the first mainboard 300 and the second mainboard 400.

Figure 5:
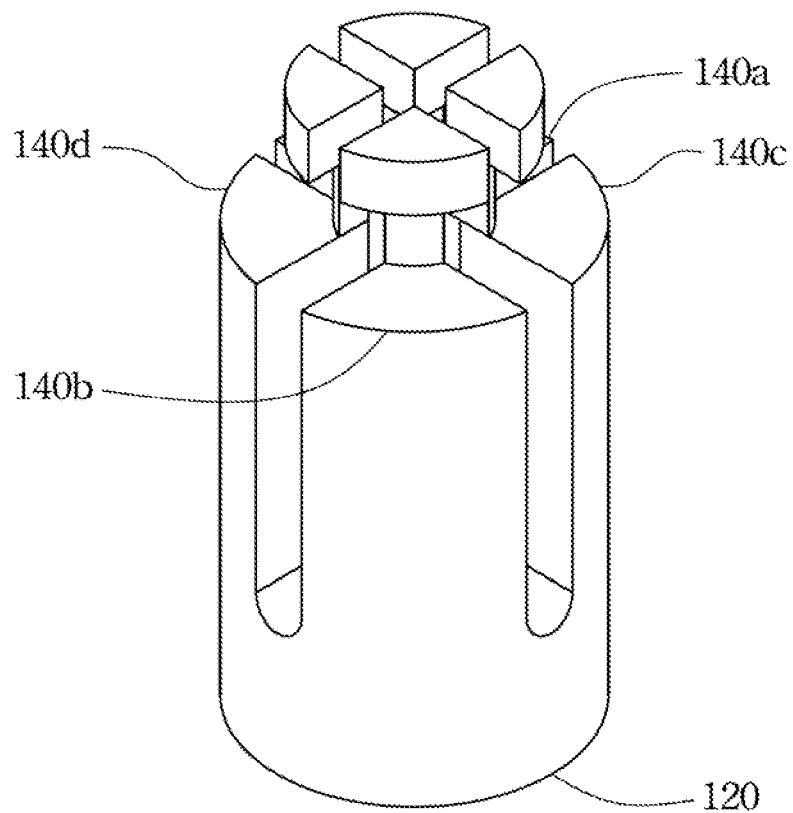
FIG. 5 is a perspective view of the boss for securing a pair of mainboards according to another embodiment of the invention.

FIG. 5 is a perspective view of the boss for securing a pair of mainboards according to another embodiment of the invention. The largest difference between the embodiments of FIGS. 1 and 5 is that, the boss for securing a pair of mainboards 100 includes four first flexible legs 140a, 140b, 140c and 140d in this embodiment, while the embodiment of FIG. 1 includes two first flexible legs 140a and 140b. In this embodiment, the first flexible legs 140a, 140b, 140c and 140d are disposed on one side of the circular top 120 and are separated from each other. It should be noted that the number of the first flexible legs in each of FIGS. 1 and 5 is only illustrative, and invention is not limited in this regard. Accordingly, in the embodiments of the invention, an odd number or an even number of the first flexible legs are used to realize the function of securing the mainboards, e.g., 2, 3, 4 ... N, where N is a natural number.

Figure 6:
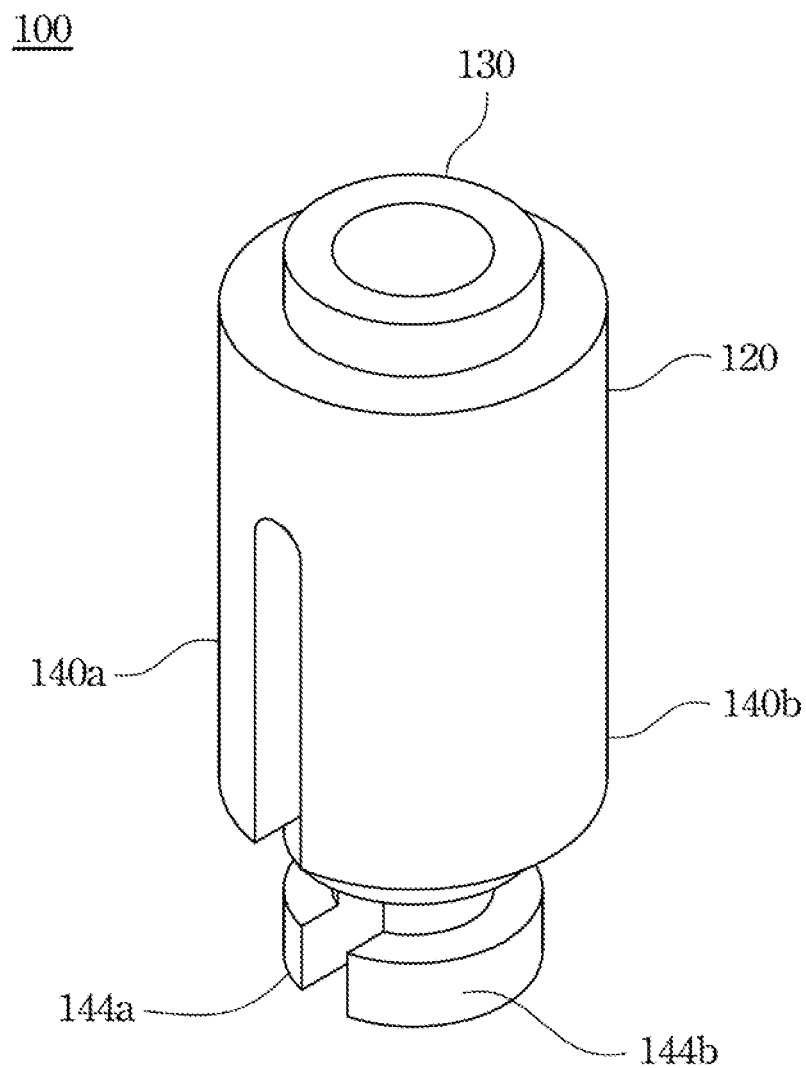
FIG. 6 is a perspective view of the boss for securing a pair of mainboards according to yet another embodiment of the invention.

FIG. 6 is a perspective view of the boss for securing a pair of mainboards according to yet another embodiment of the invention. As shown in FIG. 6, the boss for securing a pair of mainboards 100 may include a top bulging wall 130 that protrudes around the edge of the opening of the circular top 120, so as to realize enhanced securing of the mainboards.

Figure 7:
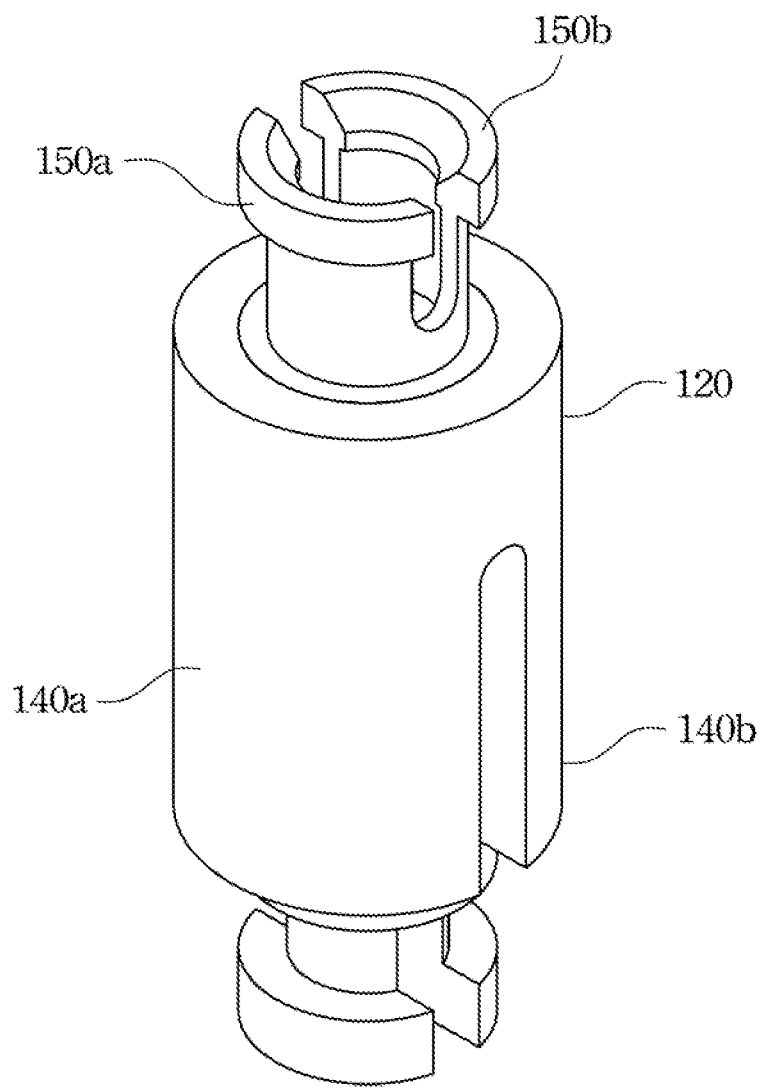
FIG. 7 is a perspective view of the boss for securing a pair of mainboards according to a further embodiment of the invention.

FIG. 7 is a perspective view of the boss for securing a pair of mainboards according to a further embodiment of the invention. As shown in FIG. 7, the boss for securing a pair of mainboards 100 may include two spatially separated second flexible legs 150a and 150b disposed on the other side of the circular top 120 opposite to the first flexible legs 140a and 140b. For example, the second flexible legs 150a and 150b may be disposed on the upper side of the circular top 120, and the first flexible legs 140a and 140b may be disposed on the lower side of the circular top 120. The first flexible legs 140a and 140b in this embodiment are the same as shown in FIG. 2, and therefore a description thereof will not be provided herein.

Figure 8:
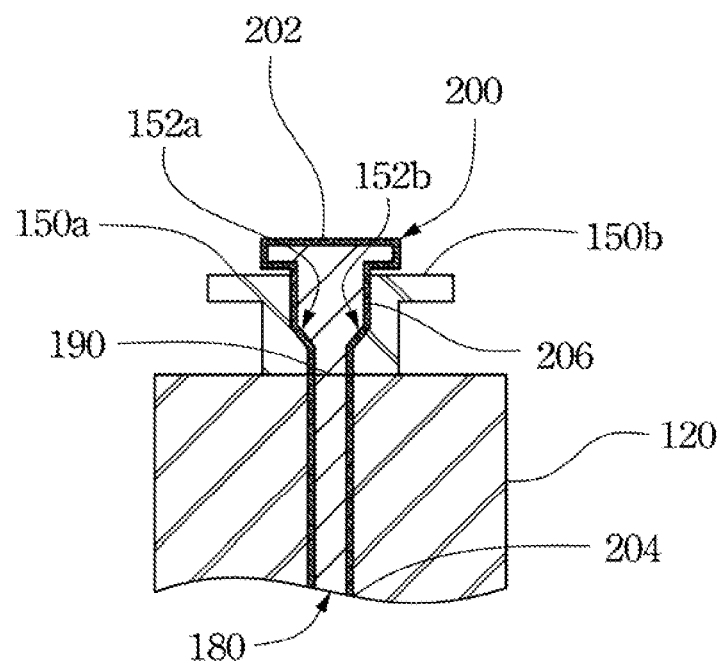
FIG. 8 is a partial sectional view of the boss shown in FIG. 7.

FIG. 8 is a partial sectional view of the boss shown in FIG. 7. As shown in FIG. 8, the second flexible leg 150a includes a tilted wall 152a formed on a surface of the second flexible leg 150a that faces the second flexible leg 150b. Similarly, the second flexible leg 150b includes a tilted wall 152b formed on a surface of the second flexible leg 150b that faces the second flexible leg 150a. The securing member 200 includes a cap body 202, a boss body 204 and a crown body 206. When the securing member 200 is inserted into a channel between the second flexible legs 150a and 150b, the crown body 206 is pressed against the tilted walls 152a and 152b to expand the same away from each other, so that the second flexible legs 150a and 150b press against the second mainboard 400 (not shown in FIG. 8). The boss body 204 is inserted into the cylindrical channel 180 through the opening 190, and is pressed against the tilted walls 142a and 142b of the first flexible legs 140a and 140b, as shown in FIG. 4. The cap body 202 is pressed and engaged with the second flexible legs 150a and 150b.

Figure 9:
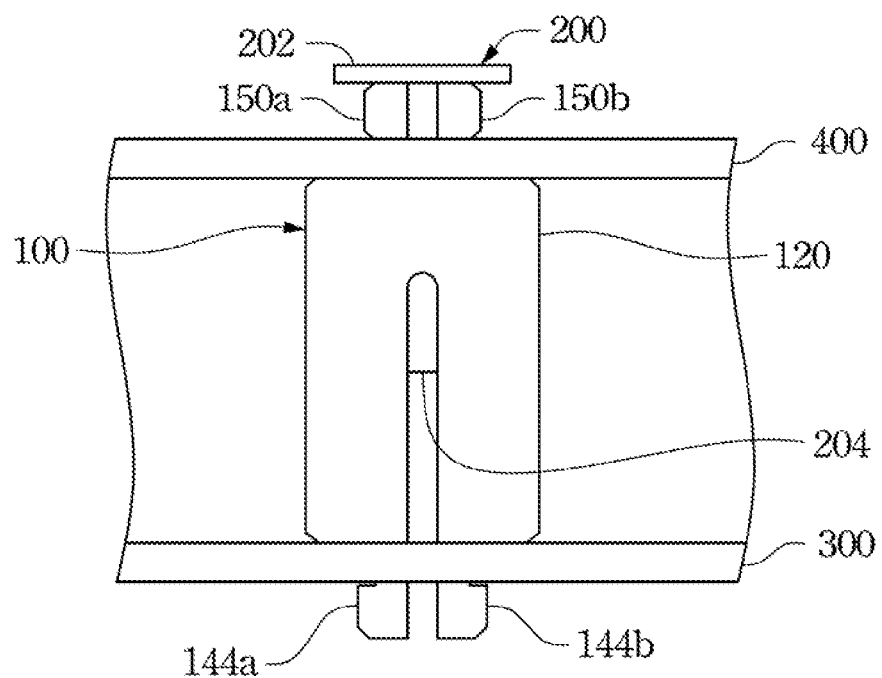
FIG. 9 is a side view of a system for securing a pair of mainboards that uses the boss for securing a pair of mainboards shown in FIG. 7.

FIG. 9 is a side view of a system for securing a pair of mainboards that uses the boss for securing a pair of mainboards shown in FIG. 7. As shown in FIG. 9, this embodiment includes a boss for securing a pair of mainboards 100, a securing member 200, a first mainboard 300 and a second mainboard 400. The securing member 200 has a cap body 202 and a boss body 204. The boss body 204 is pressed against the tilted walls 142a and 142b (see also FIG. 2). The cap body 202 is disposed on the second flexible legs 150a and 150b. The first mainboard 300 has a through-hole 302 (see also FIG. 2), which is pressed by the pressing components 144a and 144b. The second mainboard 400 is sandwiched and pressed between the second flexible legs 150a and 150b and the circular top 120. Therefore, the first mainboard 300 and the second mainboard 400 may be secured stably. Moreover, a double securing may be realized through the second flexible legs 150a and 150b and the pressing components 144a and 144b. The pressing components 144a and 144b protruding from the first mainboard 300 may be used for securing other mainboards, and the second flexible legs 150a and 150b protruding from the second mainboard 400 may be used for securing other mainboards.

In some embodiments, the first flexible legs 140a and 140b and the second flexible legs 150a and 150b may be made of elastic materials such as rubber or metal.

In some embodiments, the securing member 200 may be, but is not limited to being, a screw or a bolt.

Although the invention has been disclosed with reference to the above embodiments, these embodiments are not intended to limit the invention. It will be apparent to those skilled in the art that various modifications and variations can be made without departing from the scope or spirit of the invention. Therefore, the scope of the invention shall be defined by the appended claims.

What is claimed is:

1. A boss for securing a pair of mainboards, comprising:
    a circular top having an opening; and
    a plurality of first flexible legs disposed on one side of the circular top and separated from each other, each first flexible leg comprising:
    a tilted wall formed on a surface of said each first flexible leg that faces another first flexible leg;
    a plurality of second flexible legs disposed on the other side of the circular top opposite to the first flexible legs and separated from each other, wherein each second flexible leg comprises a tilted wall formed on a surface of said each second flexible leg that faces another second flexible leg; and
    a pressing component formed on one end of said each first flexible leg away from the circular top;
    wherein the tilted walls of all the first flexible legs cooperatively define a tapered channel.

2. The boss for securing a pair of mainboards of claim 1, wherein the pressing component of said each first flexible leg comprises:
    a body;
    a neck portion connected to the body on one end; and
    a pressing hook parallel to the body and protruding on the other end of the neck portion.

3. The boss for securing a pair of mainboards of claim 1, wherein said each first flexible leg comprises a vertical wall connected to one side of the tilted wall away from the pressing component, and the vertical walls of all the first flexible legs cooperatively define a cylindrical channel in communication with the opening.

4. The boss for securing a pair of mainboards of claim 3, wherein each of the vertical walls is provided with a thread.

5. The boss for securing a pair of mainboards of claim 1, further comprising a top bulging wall protruding from the edge of the opening of the circular top.

6. A system for securing a pair of mainboards, comprising:
a boss for securing a pair of mainboards, comprising:
a circular top having an opening; and
a plurality of first flexible legs disposed on one side of the circular top and respectively separated from each other, each first flexible leg comprising:
a tilted wall formed on a surface of said each first flexible leg that faces another first flexible leg, wherein the tilted walls of all the first flexible legs cooperatively define a tapered channel;
a plurality of second flexible legs disposed on the other side of the circular top opposite to the first flexible legs and separated from each other, wherein each second flexible leg comprises a tilted wall formed on a surface of said each second flexible leg that faces another second leg; and
a pressing component formed on one end of said each first flexible leg away from the circular top;
a securing member having a cap body and a boss body, wherein the boss body is pressed against the tilted walls of the first flexible legs;
a first mainboard having a through-hole, wherein the through-hole is pressed by the pressing components; and
a second mainboard sandwiched and pressed between the cap body and the circular top.

7. The system for securing a pair of mainboards of claim 6, wherein the pressing component of said each first flexible leg comprises:
a body;
a neck portion connected to the body on one end; and
a pressing hook parallel to the body and protruding on the other end of the neck portion.

8. The system for securing a pair of mainboards of claim 6, wherein said each first flexible leg comprises a vertical wall connected to one side of the tilted wall away from the pressing component, and the vertical walls of all the first flexible legs cooperatively define a cylindrical channel in communication with the opening.

9. The system for securing a pair of mainboards of claim 8, wherein each vertical wall is provided with a thread.

10. The system for securing a pair of mainboards of claim 6, further comprising a top bulging wall protruding from the edge of the opening of the circular top.

11. A system for securing a pair of mainboards, comprising:
a boss for securing a pair of mainboards, comprising:
a circular top having an opening; and
a plurality of first flexible legs disposed on one side of the circular top and separated from each other, each first flexible leg comprising:
a tilted wall formed on a surface of said each first flexible leg that faces another first flexible leg, wherein the tilted walls of all the first flexible legs cooperatively define a tapered channel;
a pressing component formed on one end of said each first flexible leg away from the circular top; and
a plurality of second flexible legs disposed on the other side of the circular top opposite to the first flexible legs and separated from each other, wherein each second flexible leg comprises a tilted wall formed on a surface of said each second flexible leg that faces another second flexible leg;
a securing member, comprising:
a cap body pressed and engaged with the second flexible legs;
a crown body pressed against the tilted walls of the second flexible legs; and
a boss body pressed against the tilted walls of the first flexible legs;
a first mainboard having a through-hole, wherein the through-hole is pressed by the pressing components; and
a second mainboard sandwiched and pressed between the second flexible legs and the circular top.

* * * * *